(12) United States Patent
Cao et al.

(10) Patent No.: US 8,516,404 B1
(45) Date of Patent: Aug. 20, 2013

(54) METHODS, SYSTEMS, AND ARTICLES OF MANUFACTURE FOR IMPLEMENTING CONSTRAINT CHECKING WINDOWS FOR AN ELECTRONIC DESIGN FOR MULTIPLE-PATTERNING LITHOGRAPHY PROCESSES

(75) Inventors: Min Cao, San Ramon, CA (US); Roland Ruehl, San Carlos, CA (US); Gilles S. C. Lamant, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/341,849

(22) Filed: Dec. 30, 2011

(51) Int. Cl.
*G06F 17/50* (2006.01)

(52) U.S. Cl.
USPC .................. 716/52; 716/50; 716/51; 716/54; 716/55

(58) Field of Classification Search
USPC ..................................... 716/50, 51, 52, 54, 55
See application file for complete search history.

(56) References Cited

U.S. PATENT DOCUMENTS

| | | | | |
|---|---|---|---|---|
| 6,803,554 B2* | 10/2004 | Ye et al. | | 250/208.1 |
| 6,806,456 B1* | 10/2004 | Ye et al. | | 250/208.1 |
| 6,828,542 B2* | 12/2004 | Ye et al. | | 250/208.1 |
| 7,053,355 B2* | 5/2006 | Ye et al. | | 250/208.1 |
| 7,149,998 B2* | 12/2006 | Li | | 716/53 |
| 7,184,849 B2* | 2/2007 | Van Den Nieuwelaar et al. | | 700/100 |
| 7,757,201 B2* | 7/2010 | Abrams et al. | | 716/54 |
| 7,853,920 B2* | 12/2010 | Preil et al. | | 716/52 |
| 7,879,538 B2* | 2/2011 | Wang | | 430/396 |
| 8,048,764 B2* | 11/2011 | Huang et al. | | 438/425 |
| 8,133,661 B2* | 3/2012 | Chang et al. | | 430/312 |
| 8,225,261 B2* | 7/2012 | Hong et al. | | 716/122 |
| 8,237,228 B2* | 8/2012 | Or-Bach et al. | | 257/369 |

* cited by examiner

*Primary Examiner* — Sun Lin
(74) *Attorney, Agent, or Firm* — Vista IP Law Group, LLP

(57) ABSTRACT

Disclosed are method(s), system(s), and article(s) of manufacture for implementing a layout of an electronic circuit using one or more constraint checking windows. The method identifies some constraints on multiple-patterning lithography and multiple constraint checking windows for the layout. The method determines one or more metrics for a constraint checking window or for a layout and assigns one or more shapes in the one or more constraint checking windows to their respective mask designs based on the one or more metrics. The method traverses through the one or more constraint checking windows until all shapes in the layout are assigned to their respective mask designs. The method may also determine a processing order for the one or more constraint checking windows based on the distribution of a type of shapes in the layout.

30 Claims, 15 Drawing Sheets

METHODS, SYSTEMS, AND ARTICLES OF MANUFACTURE FOR IMPLEMENTING CONSTRAINT CHECKING WINDOWS FOR AN ELECTRONIC DESIGN FOR MULTIPLE-PATTERNING LITHOGRAPHY PROCESSES

BACKGROUND

Deep sub-wavelength lithography, i.e., using the 193 nm lithography to print feature sizes/densities (e.g., for 45 nm, 32 nm, 22 nm nodes) much smaller than the wavelength (193 nm), is one of the most fundamental challenges for the nanometer CMOS scaling. Many intriguing techniques have been developed to push the limit of the 193 nm lithography, from immersion lithography to computational lithography. Nonetheless, even with these exotic techniques, the single patterning 193 nm lithography is approaching its physical limit around the 22 nm node. On the other hand, the so-called next generation lithography (NGL), including extreme ultra-violet (EUV) lithography, nano-imprint lithography (NIL), multiple e-beam direct-write (MEBDW) may still be not ready for 22 nm or perhaps even smaller nodes (e.g., 16 nm and 8 nm nodes) due to many technology challenges and economic challenges.

Double patterning lithography (DPL) is a natural extension to the single patterning lithography that uses two separate patterning processes to form two coarser patterns which are combined to form a single finer pattern. DPL is currently the forerunner for 32 nm, 22 nm, and even 16 nm. The paradigm of double patterning could be further extended to triple patterning lithography, and even quadruple patterning lithography.

Recent semiconductor fabrication development may further impose additional constraints for the multiple masks for multiple-patterning lithography processes. For example, a foundry may require that the densities for the multiple masks for the multiple-patterning lithography manufacturing processes be balanced. In addition, traditional multiple-pattern lithography requires complex, time-consuming mask splitting processes to split various shapes in a completed physical electronic design into multiple groups, which correspond to the number of masks, to cope with various constraints, design rules, and performance or yield requirements. For these traditional mask splitting processes, the addition of the additional constraints for the multiple masks further exacerbates the complexity of these processes and thus cause these traditional processes to become even more time-consuming.

Thus, there exists a need for a method, a system, and an article of manufacture for implementing a physical design of an electronic circuit by using one or more constraint checking windows.

SUMMARY

Disclosed are a method, a system, and an article of manufacture for implementing a physical electronic design subject to multiple-patterning lithography manufacturing processes of an electronic circuit using one or more constraint checking windows. Various embodiments enable an electronic circuit designer to identify one or more constraints on the multiple masks for multiple-patterning lithography processes and to identify or determine a number of constraint checking windows for the electronic design. For each of the number of constraint checking windows, some embodiments determine to which mask a particular shape is to be assigned based at least in part on certain characteristics associated with the constraint checking window and iterate through all the shapes, which have not yet been assigned to corresponding masks, in the constraint checking window at hand. These embodiments assign each unassigned shape in each constraint checking window to a respective mask while taking into account the one or more constraints. By utilizing a plurality of constraint checking windows, some embodiments assign shapes to corresponding masks while taking the one or more constraints in account and thus greatly enhance the chance that the multiple masks satisfy the one or more constraints on these masks.

In various embodiments, the method identifies a constraint for multiple-pattern lithography. The method may further determine or identify one or more characteristics of one or more constraint checking windows for multiple masks of an electronic design. For a constraint checking window of the one or more constraint checking window, the method may further determines whether the constraint is satisfied for each constraint checking window of the one or more constraint checking window. The method may further determine or identify one or more metrics for one or more mask designs of the multiple mask designs in a constraint checking window or in the entire physical electronic design. For example, the method may maintain a cumulative density or a cumulative area of a type of shapes or a relative density for a specific mask design of the multiple mask designs for the multiple-patterning lithography process that is used to manufacture the electronic circuit. The method may maintain a cumulative density or a cumulative area of a type of shapes or a relative density for a portion of a mask in a particular constraint checking window. The method may then assign a shape, which has not been assigned to any of the multiple mask designs, to one of the multiple mask designs based at least in part on the one or more metrics. The method may also update the one or more metrics based at least in part on the assignment of the shape. The method may then repeat the assignment process for other unassigned shape(s) in each of the one or more constraint checking windows. In some embodiments, the method may further identify a range or radius of influence for the current unassigned shape or for the current constraint checking window including the current unassigned shape and identify or determine one or more changes arising out of the assignment of the current unassigned shape to a specific mask. In some embodiment, the method may also determine a distribution of a specific type of shapes in the layout or in one or more specific mask designs of the layout and determine an order of processing for a plurality of constraint checking windows. The method may then process one or more shapes in the plurality of constraint checking windows in the order of processing. In some embodiments, the method processes one or more shapes in a plurality of constraint checking windows in the order or processing so determined to improve the distribution of the specific type of shapes across the layout or across one or more mask designs for the layout.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
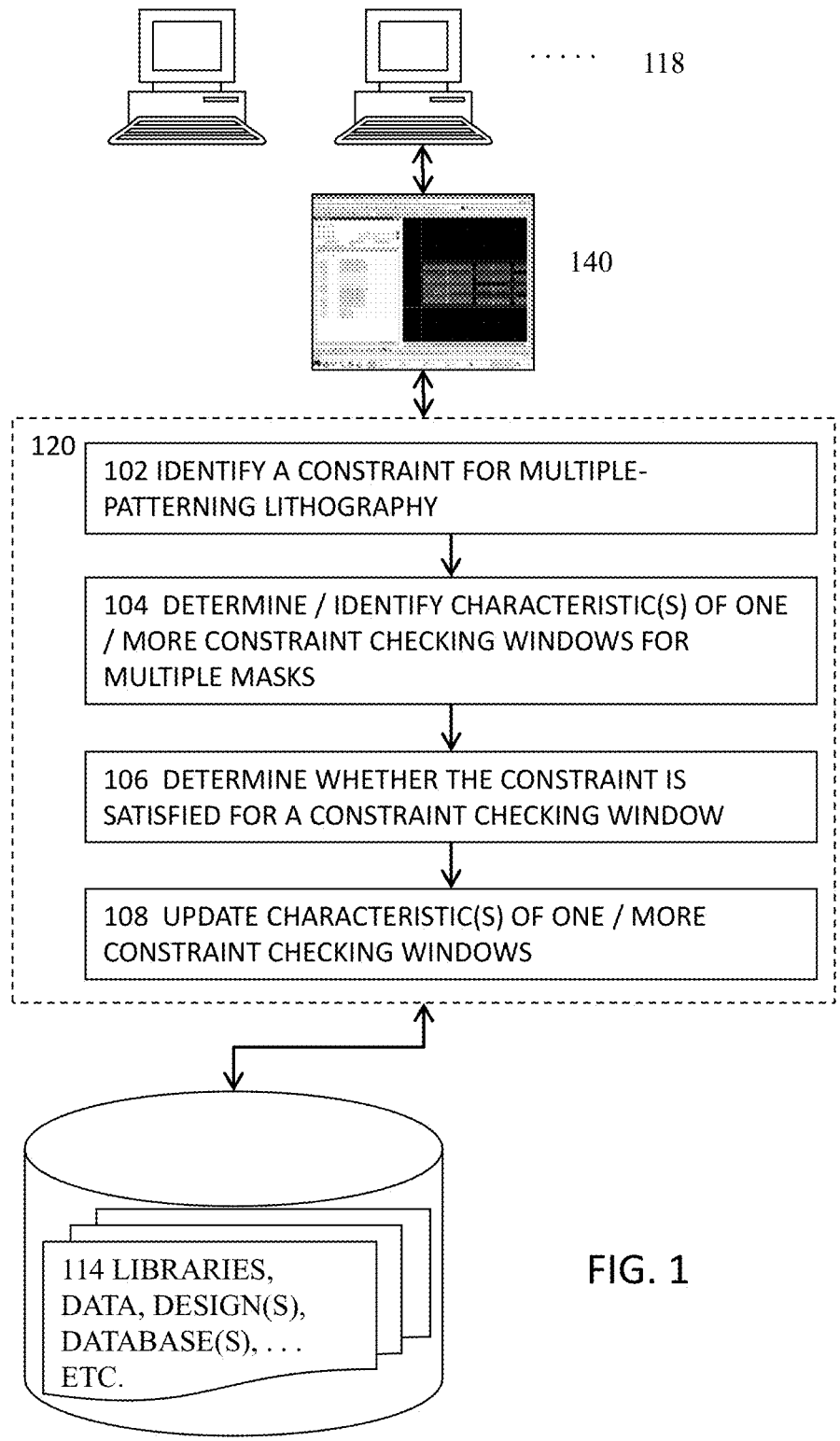
FIG. 1 illustrates a high level block diagram for a system for implementing a physical electronic design of an electronic circuit using one or more constraint checking windows in some embodiments.

Various embodiments of the invention are directed to a methods, systems, and articles of manufacture for using one or more constraint checking windows in implementing an electronic design for multiple-patterning lithography. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are a method, a system, and an article of manufacture for implementing a physical electronic design subject to multiple-patterning lithography manufacturing processes of an electronic circuit using one or more constraint checking windows. In one or more embodiments, the method or system first identifies one or more constraints on multiple mask designs for multiple-patterning lithography processes. The method may then identify or determine one or more constraint checking windows for the physical design of the electronic circuit. For a constraint checking window based at least in part upon one or more characteristics of the one or more constraint checking windows. The method may then determine or identify one or more metrics for one or more mask designs of the multiple mask designs in a constraint checking window or in the entire physical electronic design. In some exemplary embodiments, a metric may comprise a relative density of a type of shapes in a portion of a mask design within a constraint checking window or in the entire physical electronic design. A metric may comprise a cumulative area or cumulative density of a type of shapes in a portion of a mask design within a constraint checking window or in the entire physical electronic design. The method may then identify a shape in a current constraint checking window and assign the shape to a particular mask design of the multiple mask designs based on the one or more metrics. The shape that is being assigned to the particular mask design may be a shape that is being created in the physical electronic design, a shape that is being modified in the physical electronic design, or a shape that already exists in the physical electronic design but is not assigned to any specific mask design. Throughout this description, the term "unassigned shape" may be used to refer to any of the above shapes, unless otherwise specifically defined. In some exemplary implementations, the method may further determine or identify a distribution of a type of shapes in the physical electronic design or in some of the multiple mask designs. For example, the method may identify or determine the first metal distribution for the first mask design and the second metal distribution for the second mask design, etc. The method may then determine an order of processing for a plurality of constraint checking windows and process the shapes in the plurality of constraint checking windows in the order of processing so determined. In some exemplary embodiments, the method may further identify or determine a range or radius of influence for the current unassigned shape or for the current constraint checking window based at least in part upon the assignment of the current unassigned shape to a particular mask. The method may then determine or identify one or more changes within the range or radius of influence that arise out of the assignment of the current unassigned shape to a particular mask. For example, the assignment of a shape to the first mask design may require another shape, which has already been assigned to the second mask design, to be re-assigned to the second mask, if the first shape is connected to the second shape, and if a constraint requiring connected shapes to be printed with the same mask is determined to control. In some exemplary embodiments, the method may also perform one or more corrective actions. More details about the method, system, and article of manufactured are provided below in the description of figures with reference to each of the drawing figures.

FIG. 1 illustrates a high level block diagram for a method or a system for using one or more constraint checking windows in implementing an electronic design for multiple-patterning lithography in some embodiments. In one or more embodiments, a designer may use one or more computing systems 118 to perform various processes or to invoke various hardware modules to use one or more constraint checking windows in implementing an electronic design for multiple-patterning lithography. The one or more computing systems 118 may comprise various electronic design tools such as, but not limited to, a schematic editor, a schematic simulator, a physical design tool, a physical design analysis engine, a design rule checker, a physical verification engine, etc.

In some embodiments, the system provides a user interface 140 that provides information or data to and receive information or data from a user. The system may further invoke various system resources such as the processor(s) or processor core(s), memory, disks, etc. to perform the action 102 of identifying one or more constraints for multiple-patterning lithography in some embodiments. The system may also perform the actions 104 of identifying or determining one or more characteristics of one or more constraint checking windows for the multiple masks used in the multiple-patterning lithography processes for manufacturing an electronic circuit design in some embodiments. The system may also perform the actions 106 of determining whether the one or more constraints is satisfied for a constraint checking window of the one or more constraint checking windows. The system may also perform the actions 108 of updating at least one of the one or more characteristics of the one or more constraint checking window based at least upon an assignment of an unassigned shape to a particular mask in some embodiments. The system may also interact with various libraries, various design data, various other data and information, one or more databases such as schematic and physical design databases, etc. 114 that are stored on a volatile or non-volatile computer accessible medium in facilitating the performances of any of the processes or actions described herein.

Figure 2A:
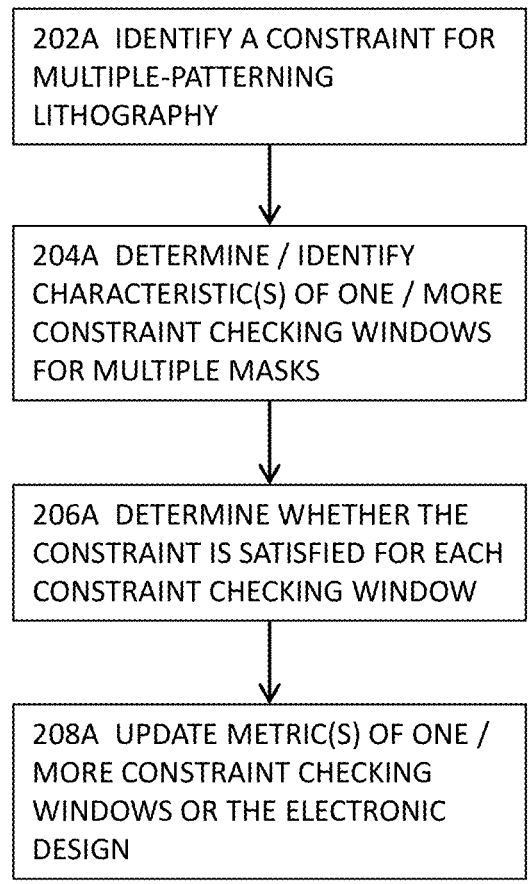
FIG. 2A illustrates a high level flow diagram for a method or a system for implementing a physical electronic design of an electronic circuit using one or more constraint checking windows in some embodiments.

FIG. 2A illustrates a high level flow diagram for a method or a system for using constraint checking windows in implementing an electronic design for multiple-patterning lithography in some embodiments. In one or more embodiments, the method may comprise the process 202A of identifying one or more constraints for multiple masks of an electronic circuit design used in multiple-patterning lithography processes for manufacturing the electronic circuit design. In various embodiments, a constraint may comprise a design rule, a requirement that may or may not be violated or relaxed, a goal or objective that may or may not be met, or a performance measure that may positively or negatively affect, for example, yield, cost, etc. An example of a performance measure is that a violation with the performance measure causes deduction in yield of the electronic circuit. In some embodiments, the one or more constraints may comprise a density requirement that requires that the respective densities of the multiple masks to balance or to match to a certain extent. For example, the density requirement may require that one metal density of one of the two masks for double-pattern lithography to be within 5% of the density of the other mask of the two masks. In some embodiments, the method for using constraint checking windows in implementing an electronic design for multiple-patterning lithography may comprise the process 204A of determining or identifying one or more characteristics for one or more constraint checking windows. A constraint checking window comprise a portion of an electronic circuit design (e.g., a physical design of the electronic circuit) to which various processes apply in some embodiments. In some embodiments where the method or system utilizes only one constraint checking window, the constraint checking window comprises the entire electronic circuit design. For example, a constraint checking window may comprise a 20 microns by 30 microns area. In some embodiments, the method or the system allows a user or a designer to determine the size, width, length, shape, or orientation of each constraint checking window. In some embodiments, the method or the system may allow a user or a designer to determine a total number of constraint checking windows for a specific electronic circuit design, and the method or the system determines the appropriate size, shape, or orientation of each constraint checking window. In some embodiments, the method or the system may allow non-uniform constraint checking windows. For example, the method or the system may allow a first set of constraint checking windows each having the first size or shape in a first portion of an electronic circuit design and a second set of constraint checking windows each having a second size or shape in a second portion of the same electronic circuit design. In some embodiments, two adjacent checking windows may overlap each other. In some embodiments, two adjacent checking windows may be connected with each other at a common boundary without any overlaps. In some other embodiments, there may exist a gap between two constraint checking windows. As a result, the one or more characteristics may comprise the size of an overlap or a gap between two adjacent constraint checking windows in some embodiments. In these embodiments, an overlap of zero distance or a gap of zero distance indicates that two adjacent constraint checking windows share a common boundary. In some embodiments, the one or more characteristics may also comprise multi-dimensional overlaps or gaps. For example, the method or the system may allow the specification of a x-overlap or x-gap to indicate the relative position of two adjacent constraint checking windows in the x-direction. Similarly, the method or the system may allow the specification of a y-overlap or y-gap to indicate the relative position of two adjacent constraint checking windows in the y-direction. The one or more characteristics may also comprise one or more step sizes for the constraint checking windows. For example, the method or the system may allow the specification of an x-step size of 15 microns and a y-step size of 18 microns for a set of 20 microns by 20 microns constraint checking windows in a portion of an electronic circuit design.

In some embodiments, the method for using constraint checking windows in implementing an electronic design for multiple-patterning lithography may comprise the process 206A of determining whether the one or more constraints identified at 202A are satisfied. In some embodiments, the method or the system may determine whether the one or more constraints are satisfied while the system is processing each constraint checking window. In the previous example where a constraint comprises a metal density match between a double mask design, the method or the system may determine whether the deviation in the corresponding metal densities of the two masks falls within some prescribed range (e.g., 3.5%). In some embodiments, the method for using constraint checking windows in implementing an electronic design for multiple-patterning lithography may comprise the process 208A of updating one or more metrics of the one or more constraint checking windows or of the entire electronic circuit design. In some embodiments where the constraint includes, for example, a density match requirement among multiple masks for the electronic circuit design or a maximum allowable relative density for the double masks of a two-mask patterning lithography process, the one or more metrics may include a first cumulative density or area of a certain material (e.g., metal) of the first mask and a second cumulative density or area of the same material of the second mask. In these embodiments, the method or the system may maintain a bucket for each mask and keep a running total of a respective cumulative density or respective cumulative area in the bucket.

Figure 2B:
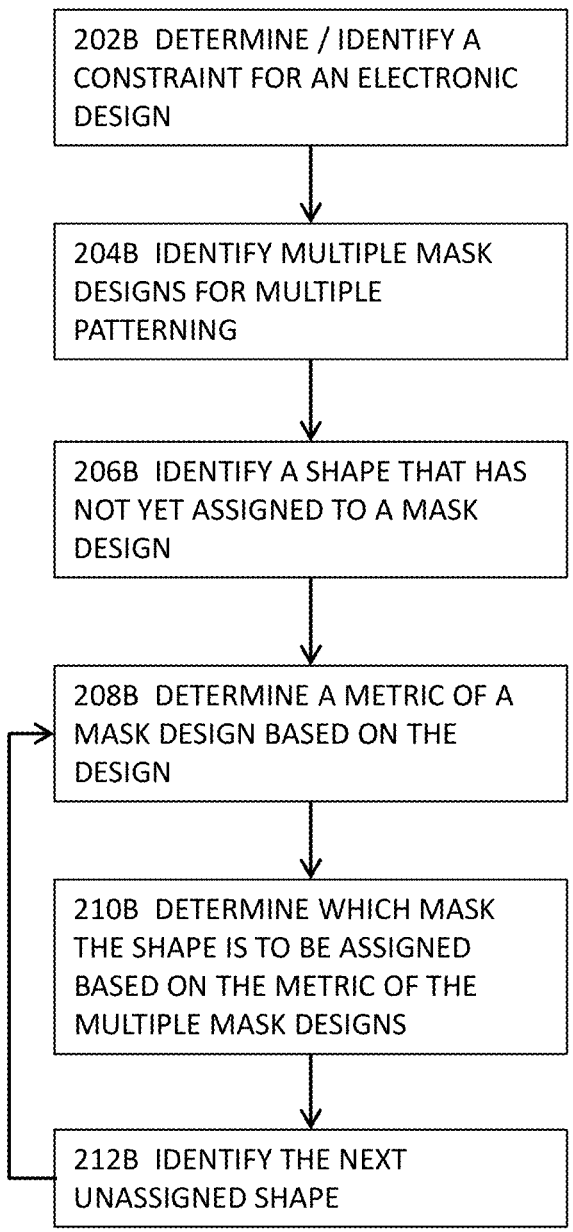
FIG. 2B illustrates a more detailed flow diagram for a method or a system for implementing a physical electronic design of an electronic circuit using one or more constraint checking windows in some embodiments.

FIG. 2B illustrates a more detailed flow diagram for a method or a system for using constraint checking windows in implementing an electronic design for multiple-patterning lithography in some embodiments. In some embodiments, the method for using constraint checking windows in implementing an electronic design for multiple-patterning lithography may comprise the process 202B of identifying or determining one or more constraints for a multiple-patterning electronic circuit design. In some embodiments, the one or more constraints comprise a density matching constraint among the multiple masks for the multiple-patterning lithography processes for manufacturing the electronic circuit. In some embodiments, the method for using constraint checking windows in implementing an electronic design for multiple-patterning lithography may comprise the process 204B of identifying the multiple mask designs for the multiple-patterning lithography processes. In some embodiments, the method or the system may associate a particular mask design with a particular color. In some of these embodiments, the method or the system may further color the shapes, which have been assigned to the particular mask, with the particular color. For example, the method or the system may associate a first mask design with the color green and the second mask design with the color red. In this example, the method or the system may further color all the shapes assigned to the first mask design with the color green, and all the shapes assigned to the second mask design with the color red. In some embodiments, any of the multiple mask designs may comprise zero or more shapes that have been assigned to particular masks. For example, a mask may include no shapes at the beginning stage of the mask design process in some embodiments. In some other embodiments, a mask may comprise some shapes, which have been assigned to this particular mask, while the electronic circuit design still includes other shapes that have not been assigned to any masks. In some embodiments, the method for using constraint checking windows in implementing an electronic design for multiple-patterning lithography may comprise the process 206B of identifying a shape that has not been assigned to a mask design. It shall be noted that in these embodiments, the unassigned shape may have already existed in the electronic design in some embodiments, whereas the unassigned shape may also be created for the first time in the electronic design in some other embodiments. In these latter embodiments, the method and the system interactively or in nearly real-time determines the assignment of shapes, even when some of these shapes are being created in an electronic circuit design. In some embodiments, being in real-time includes the scenarios where certain operations (e.g., assignment of shapes to masks) are relating to a time frame that is imposed by external constraints, and the response of a system for these certain operations matches a user's perception of time or proceeds at the same rate as a physical or external process. Nonetheless, it is also understood that any operations on a computing system may take certain period of time, which may vary from a few nanoseconds to some extended period of time. For example, it may take the system a split of a second to determine the respective densities of the multiple masks and to assign an unassigned shape to a particular mask based on, for example, the relative densities of the multiple masks. Nonetheless, the aforementioned "in nearly real-time" refers to the fact that the system may still need a period of time to complete the assignment of an unassigned shape to a mask while the shape is being created or manipulated in an electronic circuit design, although this period of time may not even be perceptible by a human designer or user. In some embodiments, the method or the system may further associate all the unassigned shapes with a particular color or one or more textual or graphical mask indicators. In some embodiments, the method or the system may further associate all the unassigned shapes with pointers, symbolic links, or other flags that correlate these unassigned shapes with their corresponding masks. For example, the method may even identify each shape with its respective mask by using a single- or multiple-bit data. More specifically, in a two-mask design, the method may use a single-bit data for each shape, where a value of 0 for the single-bit data indicates that a shape belongs to a first mask, and a value of 1 indicates that a shape belongs to a second mask. In some of these embodiments, the method or the system may further color all the unassigned shapes with the particular color. For example, the method or the system may associate all the unassigned shapes with the color gray and may further color all the shapes in an electronic circuit design with the color gray. In some embodiments, the method for using constraint checking windows in implementing an electronic design for multiple-patterning lithography may comprise the process 208B of determining one or more metrics for each mask design based on the electronic circuit design. In some embodiments, the one or more metrics comprise cumulative surface area of a particular material or density of a particular material in a particular mask. For example, a metric for a particular mask may comprise the total surface area of all metal shapes in a particular mask design. The method or the system may add all the surface areas of metal shapes in a particular mask design to determine the cumulative metal surface area. Another example of a metric is that a metric may comprise the metal density of a particular mask design. The method may also divide the cumulative metal surface area by the total area of the mask design to determine the metal density of the particular mask design. In some embodiments, the method for using constraint checking windows in implementing an electronic design for multiple-patterning lithography may comprise the process 210B of determining which mask the shape if to be assigned based on the one or more metrics determined at 208B. For example, if a constraint requires metal density match between two mask designs, and if it is determined that the first metal density of the first mask design is higher than the second metal density of the second mask design, the method or the system may assign the unassigned shape to the second mask at 210B. In some embodiments, the method for using constraint checking windows in implementing an electronic design for multiple-patterning lithography may comprise the process 212B of identifying the next shape that has not been assigned to a particular mask. The method or the system may then loop back to 208B to re-determine the one or more metrics of one or more masks. In the previous example where an unassigned shape was assigned to the second mask design, the method or the system may then re-determine the metal density (assuming the unassigned shape comprises at least some metal areas) of the second mask design without re-determining the metal density for the first mask design because the metal density of the first mask design has not changed since the last determination. The method or the system may then repeat the process until all the shapes that have not been assigned to a particular mask design in some embodiments.

Figure 2C:
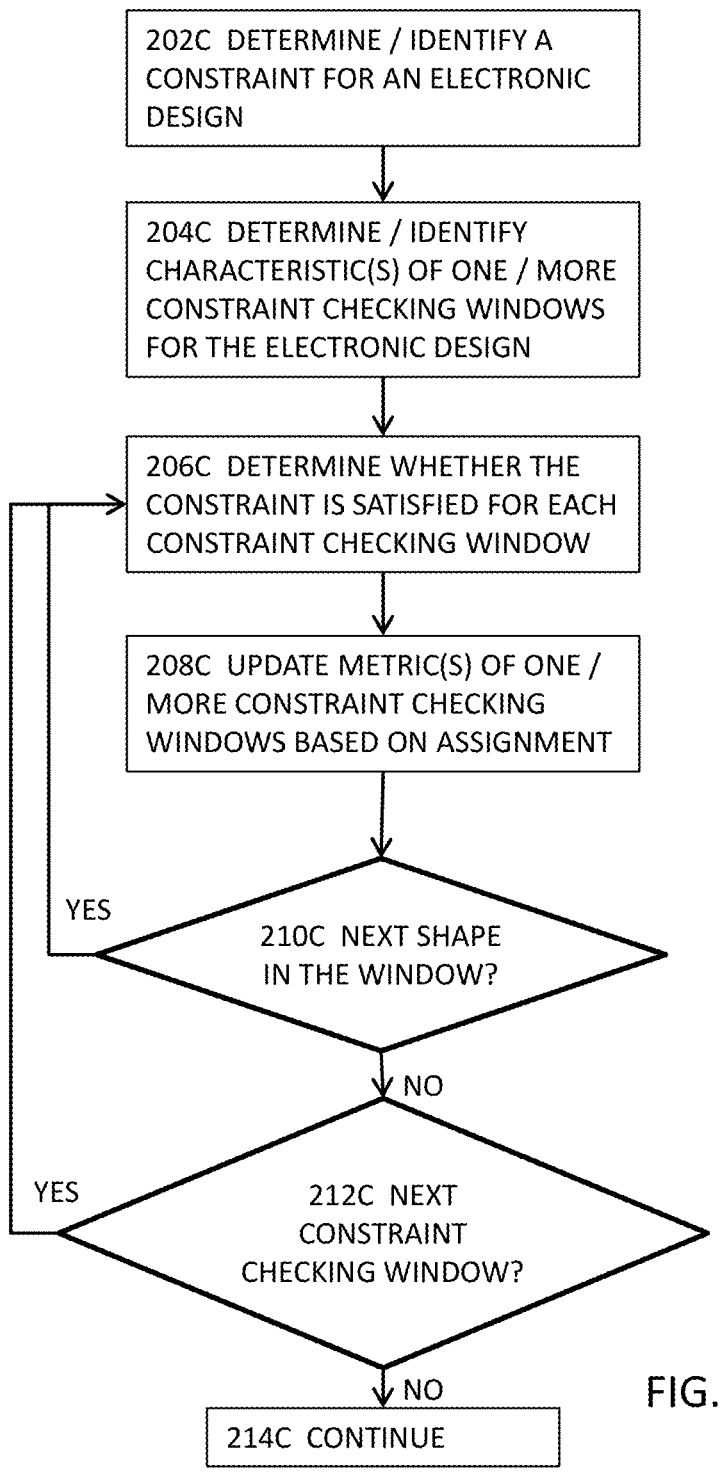
FIG. 2C illustrates a more detailed flow diagram for a method or a system for implementing a physical electronic design of an electronic circuit using one or more constraint checking windows in some embodiments.

FIG. 2C illustrates a more detailed flow diagram for a method or a system for using one or more constraint checking windows in implementing an electronic design for multiple-patterning lithography in some embodiments. In some embodiments, the method for using constraint checking windows in implementing an electronic design for multiple-patterning lithography may comprise the process 202C of identifying or determining one or more constraints for an electronic circuit design. In some embodiments, the one or more constraints are imposed by a semiconductor foundry. In some embodiments, the one or more constraints may comprise a density matching constraint which requires the respective densities of multiple masks for manufacturing the electronic circuit with multiple-patterning lithography processes to be balanced or matched within some prescribed ranges. In some embodiments, the one or more constraints may comprise a maximal relative density among the multiple masks. In some embodiments, the method for using constraint checking windows in implementing an electronic design for multiple-patterning lithography may comprise the process 204C of identifying or determining one or more characteristics of one or more constraint checking windows for the electronic design. In some embodiments, the one or more characteristics may comprise a size of a set of constraint checking windows. In some embodiments, the one or more characteristics may comprise the gap or overlap between two adjacent constraint checking windows. For example, the method or the system may allow the specification of a x-overlap or x-gap to indicate the relative position of two adjacent constraint checking windows in the x-direction. In some embodiments, the one or more characteristics may comprise one or more step sizes. For example, the method or the system may allow the specification of an x-step size of 15 microns and a y-step size of 17 microns for a set of 20 microns by 20 microns constraint checking windows in a portion of an electronic circuit design. In some embodiments, the method for using constraint checking windows in implementing an electronic design for multiple-patterning lithography may comprise the process 206C of identifying a constraint checking window from the one or more constraint checking window and determining whether the constraint is satisfied for the identified constraint check window. In some embodiments, the process 206C may further include the sub-process of identifying an unassigned shape that has not been assigned to any of the multiple masks. The process 206C may further include the sub-process of assigning the identified, unassigned shape to a particular mask based on the one or more characteristics. For example, the method or the system may identify a first metal density for a first mask of the electronic design as the first characteristic of the constraint checking window and a second metal density for a second mask of the electronic design as the second characteristic of the constraint checking window. In this example, if the method determines that the first density of the first mask is higher than the second density of the second mask, the method or the system may identify an unassigned shape, which has not been assigned to any particular mask of the multiple masks, and assign the unassigned shape to the second mask. In some embodiments, the method for using constraint checking windows in implementing an electronic design for multiple-patterning lithography may comprise the process 208C of updating at least some of the one or more metrics of the one or more constraint checking windows based on assignment of the unassigned shapes. In the previous example where the method assigns an unassigned shape to a second mask based on a lower metal density or a lower total metal area of the second mask that is determined prior to the assignment, the method may then update the metal density or the cumulative metal area to reflect the assignment of the unassigned shape to the second mask, while maintaining the other metal densities or cumulative metal shapes of other masks. At 210C, the method or the system may identify another unassigned shape in the current constraint checking window and loops back to 206C to determine and assign this unassigned shape to the appropriate mask, while keeping the one or more constraints in check as described for 206C-208C above. At 212C, the method or the system may proceed to the next constraint checking window of interest and loops back to 206C to determine and assign this unassigned shape to the appropriate mask, while keeping the one or more constraints in check as described for 206C-210C above in some embodiments. The next constraint checking window may include a constraint checking window having one or more shapes that have not been assigned to any particular masks in some embodiments. The next constraint checking window may include a constraint checking window in which the designer or user wishes to create one or more new shapes or modify one or more existing shapes in some embodiments. For example, if a designer intends to reroute an interconnect to connect a first existing shape and a second existing shape that belong to two different masks in these embodiments, and if there exists a design rule requiring two connected shapes be printed with the same mask, the method or the system may automatically determine whether the assignment of the first existing shape or that of the second existing shape needs to be changed and may further automatically reassign one of the two existing shapes to the mask of the other shape of the two existing shapes. As another example where a constraint requires metal density match or some allowable maximal relative metal density, the method or the system may also identify one or more additional constraint checking windows in which the designer intends to add or remove metal fill for planarization purposes, the method or the system may then examine the mask assignments for the shapes in these additional constraint checking windows or in even further augmented region to determine whether the mask assignments need to be modified according to the addition or removal of metal fills.

Figure 3:
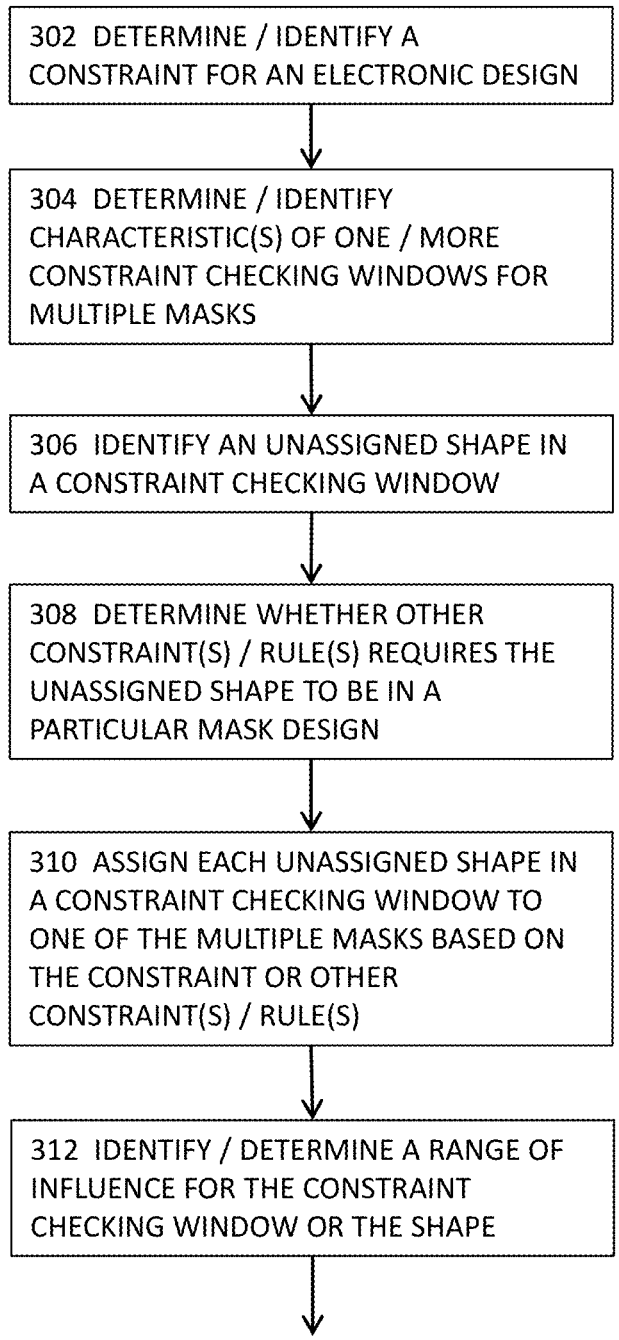
FIG. 3 illustrates another more detailed flow diagram for a method or a system for implementing a physical electronic design of an electronic circuit using one or more constraint checking windows in some embodiments.
Figure 3:
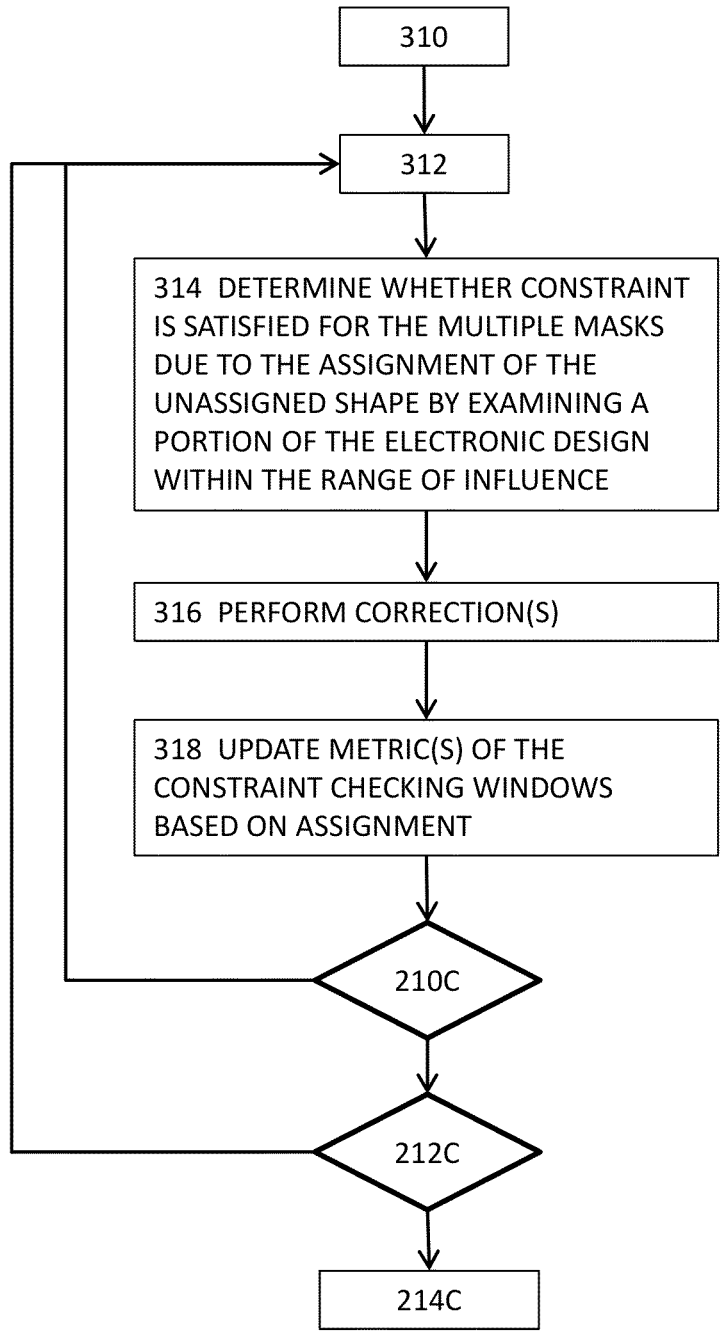

FIG. 3 illustrates another more detailed flow diagram for a method or a system for using one or more constraint checking windows in implementing an electronic design for multiple-patterning lithography in some embodiments. In some embodiments, the method may comprise a process 302 for identifying or determining one or more constraints for an electronic circuit design. In some embodiments, the one or more constraints comprise a density match requirement or a maximal relative density among the multiple masks for manufacturing the electronic circuit with multiple-patterning lithography processes. In some embodiments, the one or more constraints may include other constraints, design rules, or requirements for splitting the electronic circuit design into multiple mask designs. In some embodiments, the one or more constraints may include one or more same mask rules that require certain shapes (e.g., shapes that overlap or share the same edge(s) or shapes connected by one or more interconnects) be in the same mask design. The method or the system may further include the process 304 for identifying or determining one or more characteristics of one or more constraint checking windows in some embodiments. In some embodiments, the one or more characteristics may comprise the size of an overlap or a gap between two adjacent constraint checking windows. In some embodiments, the one or more characteristics may also comprise multi-dimensional overlaps or gaps. The one or more characteristics may also comprise one or more step sizes for the constraint checking windows in some embodiments. The method or the system may also include the process 306 for identifying an unassigned shape, which has not been assigned to any particular mask or has been assigned to a mask but is currently undergoing some changes, in a current constraint checking window in some embodiments. In some embodiments, the unassigned shape includes a shape that is being created for the first time in the electronic circuit design. In some other embodiments, the method or the system may further identify an existing shape that is undergoing some modification process that may affect the compliance or violation of the one or more constraints, whether or not this existing shape has been assigned to a particular mask. For example, an existing shape may have been assigned to a first mask, but a modification process, such as one that connects the existing shape to a second shape belonging to a second mask or that routes an interconnect the first existing shape to the second existing shape belonging to a second mask, may require the first shape to be assigned or reassigned to the second mask. In some embodiments in this description, an unassigned shape includes and thus collectively refer to a shape that has not been assigned to any particular mask or a shape whose assignment to a particular mask may be altered. At 308, the method or the system may further determine whether there exist one or more constraints, requirements, or design rules that require the unassigned shape to be in a specific mask in some embodiments. For example, a designer may designate a particular shape and require this particular shape to be in a specific mask. If the method or system determines that a particular unassigned shape needs to be assigned to a specific mask, the method or the system will proceed as required and issues a warning, hint, or error to reflect the fact that the assignment of this particular shape to a specific mask violates or exacerbates at least one of the one or more constraints identified or determined at 302. In some embodiments, the method or the system may then assign this unassigned shape as required, update the relevant metrics of the corresponding mask and proceed with further assignments for other shapes to further balance the densities among the multiple masks. At 310, the method or the system may assign the unassigned shape in the current constraint checking window to a particular mask based on the one or more constraints identified at 302 or based on the one or more constraints, requirements, or design rules that require the unassigned shape to be in a specific mask identified at 308 in some embodiments. In these embodiments, the method or the system assigns the current unassigned shape to a mask while keeping the one or more constraints identified at 302 or 308 in check. In some other embodiments where the one or more constraints identified at 302 conflict with the one or more constraints identified at 308, the method or the system may offer both sets to the user with more details for each set to explain the consequences of selecting either set of one or more constraints for assignment of the unassigned shape. At 312, the method or the system may identify or determine a range or radius of influence for the constraint checking window or the unassigned shape in some embodiments. In these embodiments, the method or the system utilizes the range or radius of influence to determine how far or how big of an area in the electronic circuit design the method or the system needs to examine to determine the cascading effects of assigning the current unassigned shape to a particular mask. In one example, the method or the system may utilize a default range or radius of influence that may include, for example, the current display window in the physical design session for the electronic circuit design. In some embodiments, the method or the system may utilize connectivity information for the unassigned shape, the net thereof, or electrical or parasitic effects to determine the range or radius of influence. For example, the method or the system may utilize the connectivity information to identify what other shapes are connected directly or indirectly to the current unassigned shape or what other nets are connected to or interacting with the net to which the current unassigned shape belongs in order to determine the range or radius of influence. Once the range or radius of influence is determined, the method or the system may further examine the shapes and their assignments to masks within the range or radius of influence to determining the cascading effects of assigning the current unassigned shape to one particular mask or another. At 314, the method or the system may further determine whether the one or more constraints identified at 302 are satisfied for the multiple masks in light of the assignment of the current unassigned shape to a particular mask design in some embodiments. In some of these embodiments, the method or the system may determine whether the one or more constraints are satisfied by examining a portion of the electronic design within the range or radius of influence. In some other embodiments where the method or the system maintains the cumulative total area or cumulative density for each mask design, the method or the system may utilize such cumulative total area or cumulative density data to determine whether the one or more constraints identified at 302 are satisfied. In these embodiments, the method or the system maintains a global view of the entire electronic circuit design to ensure that the one or more constraints are satisfied. In some other embodiments, the method or the system may examine only the current constraint checking window or only the area within the range or radius of influence to determine whether the one or more constraints are satisfied. At 316, the method or the system may perform some corrective actions based at least on the one or more constraints identified at 302 and the assignment of the current unassigned shape to a particular mask in some embodiments. In some of these embodiments, the method or the system may further perform some corrective actions based further on one or more other constraints or requirements such as some planarization requirements to prevent dishing or erosion problems during some planarization processes. For example, the method or the system may add or remove dummy fills (metal, oxide, or other materials) to or from a particular area (e.g., a constraint checking window or a region in the electronic circuit design). In some embodiments where the maximal relative density constraint is skewed due to the assignment of the current unassigned shape to a mask, the method or the system may also ensure further assignments of unassigned shapes are directed to other mask designs to balance the relative densities of the multiple mask designs. At 318, the method or the system may update one or more metrics of the one or more constraint checking windows based on the assignment of the shape or the corrective actions in some embodiments. In the previous example where the method assigns an unassigned shape to a second mask based on a lower metal density or a lower cumulative metal area of the second mask that is determined prior to the assignment, the method may then update the metal density or the cumulative metal area to reflect the assignment of the unassigned shape to the second mask, while maintaining the other metal densities or cumulative metal shapes of other masks. The method or the system may further proceed to 210C, 212C, and 214C as described above with reference to FIG. 2C.

Figure 4:
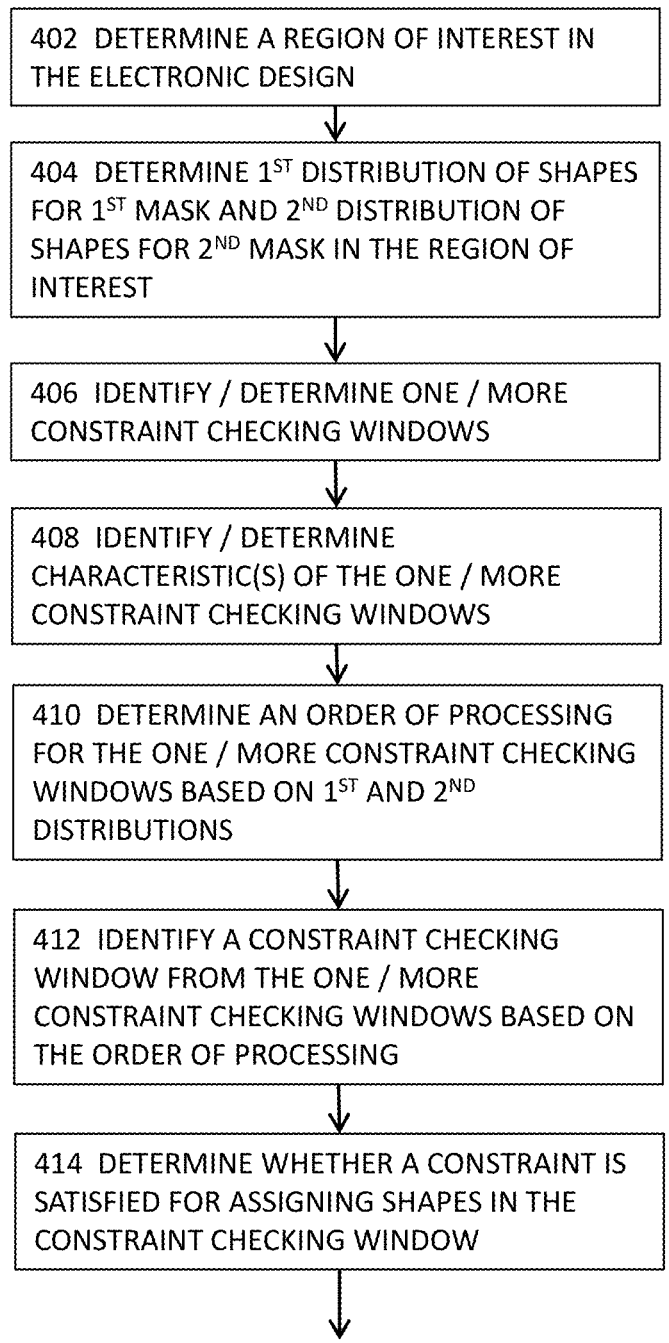
FIG. 4 illustrates another more detailed flow diagram for a method or a system for implementing a physical electronic design of an electronic circuit using one or more constraint checking windows in some embodiments.
Figure 4:
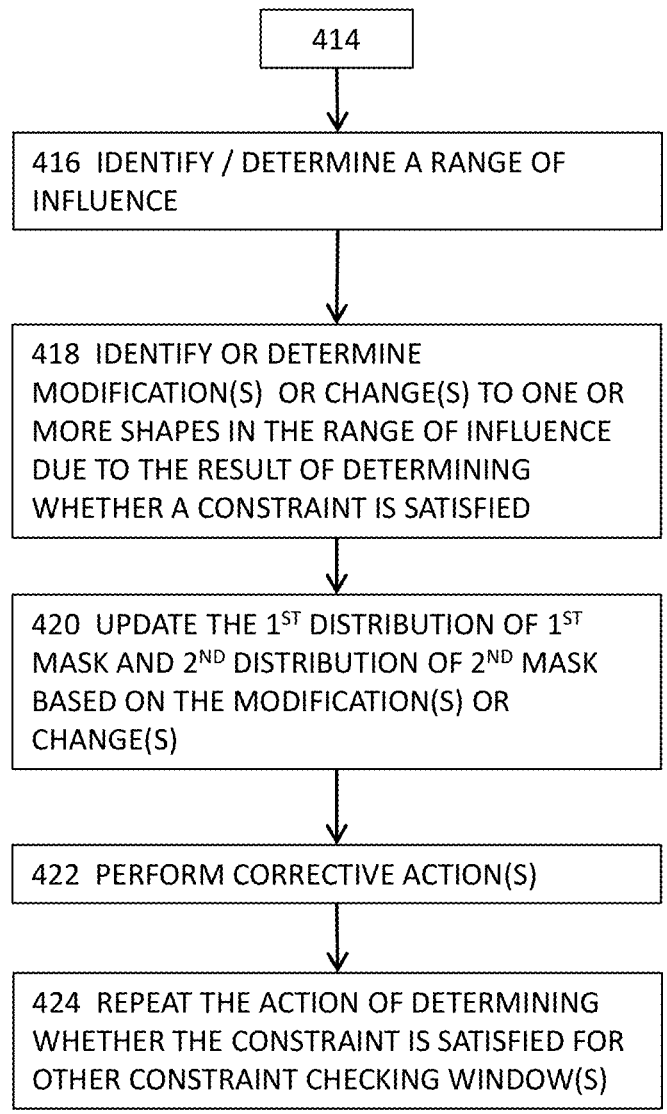

FIG. 4 illustrates another more detailed flow diagram for a method or a system for using one or more constraint checking windows in implementing an electronic design for multiple-patterning lithography in some embodiments. In some embodiments, the method or the system may comprise the process or module 402 of determining a region of interest in the electronic circuit design. In some embodiments, the region of interest may comprise a smaller portion of the entire electronic circuit design. In some of these embodiments where the method or the system is processing a current constraint checking window or a particular shape in the current constraint checking window, the method or the system may identify or determine the region of interest as the area within a range or radius of interest as described for 312. In some embodiments, the region of interest may comprise the entire electronic circuit design. In some embodiments, the method or the system may comprise the process or module 404 of determining a distribution of shapes in the region of interest the electronic circuit design. In some embodiments, the process or module 404 may determine the first distribution of shapes for a first mask and a second distribution of shapes for a second mask in the region of interest. For example, the method or the system may determine the first distribution of metal shapes for the first mask design and the second distribution of metal shapes for the second mask design in these embodiments. In some embodiments, the method or the system may comprise the process or module 406 of identifying or determining one or more constraint checking windows and the process or module 408 of identifying or determining one or more characteristics of the one or more constraint checking windows in a similar manner as those described with reference to FIGS. 2C and 3. In some embodiments, the method or the system may comprise the process or module 410 of determining an order of processing for the one or more constraint checking windows based at least in part upon the first distribution and the second distribution. For example, the method or the system may first determine the distribution of metals in the electronic circuit design or the region of interest therein and a plurality of constraint checking windows for the electronic circuit design. In this example where the method or the system further identifies that, for example, the electronic circuit design or the designs for the multiple masks in the upper left-hand corner or one or more specific constraint checking windows therein include relatively fewer metal shapes, the method or the system may determine the order of processing by starting at the upper left-hand corner to avoid having unbalanced metal densities in the final mask designs. In some embodiments, the method or the system may determine the order of processing for the one or more constraint checking windows to be in the reverse order of shape densities of certain materials of the one or more constraint checking windows. In some embodiments, the method or the system may further include the process or module 412 of identifying a constraint checking window from the one or more constraint checking windows based at least on the order of processing determined at 410. In some embodiments, the method or the system may further comprise the process or module 414 of determining whether the one or more constraints are satisfied for processing the shapes in the current constraint checking window. For example, the method or the system may determine whether the maximal relative density constraint or the density match constraint is satisfied due to one or more assignments of shapes in the current constraint checking window in some embodiments. As another example, the method or the system may calculate the density of a material (e.g., metal or oxide) of each of the multiple masks and determine whether these densities of the multiple masks satisfy a constraint that requires the relative density of the multiple masks not to exceed a certain number, such as 4 percent. In some other embodiments where the method or the system maintains the relevant data for the multiple masks of the entire electronic circuit design, the method or the system may determine whether the maximal relative density constraint or the density match constraint is satisfied for the multiple mask designs of the entire electronic circuit design. In other words, the method or the system is able to ensure the satisfaction of the one or more constraints at the local level, the global level, or both. In some embodiments, the method or the system may further include the process or module 416 of identifying or determining a range or radius of influence in a substantially similar manner as that described in 312 with reference to FIG. 3. In some embodiments, the method or the system may further include the process or module 418 of identifying or determining one or more modifications or changes to one or more shapes within the range or radius of influence that arise out of the determination of whether the one or more constraints are satisfied at 414. The one or more changes may include the changes of mask assignments in one or more shapes in the range or radius of influence due to the assignment of the current unassigned shape to a specific mask in some embodiments. For example, the method or the system may have to reassign the first shape, which has been assigned to the first mask, to the second mask to comply with a constraint requiring connected shapes be in the same mask if the first shape is directly or indirectly connected to the current unassigned shape, and if the current unassigned mask is assigned to the second mask. In some embodiments, the method or the system may further include the process or module 420 of updating the distribution of shapes in the region of interest in view of the assignment of the current unassigned shape at 414 and the one or more changes identified or determined at 418. In some embodiments, the method or the system may update the first distribution of shapes for the first mask and the second distribution of shapes for the second mask for a double-patterning lithography process to accommodate the assignment of the current unassigned shape at 414 and the one or more changes identified or determined at 418. At 422, the method or the system may optionally perform one or more corrective actions in a substantially similar manner as that described for 316 with reference to FIG. 3 in some embodiments. At 424, the method or the system may repeat the action of determining whether the one or more constraints are satisfied for one or more other constraint checking windows.

Figure 5:
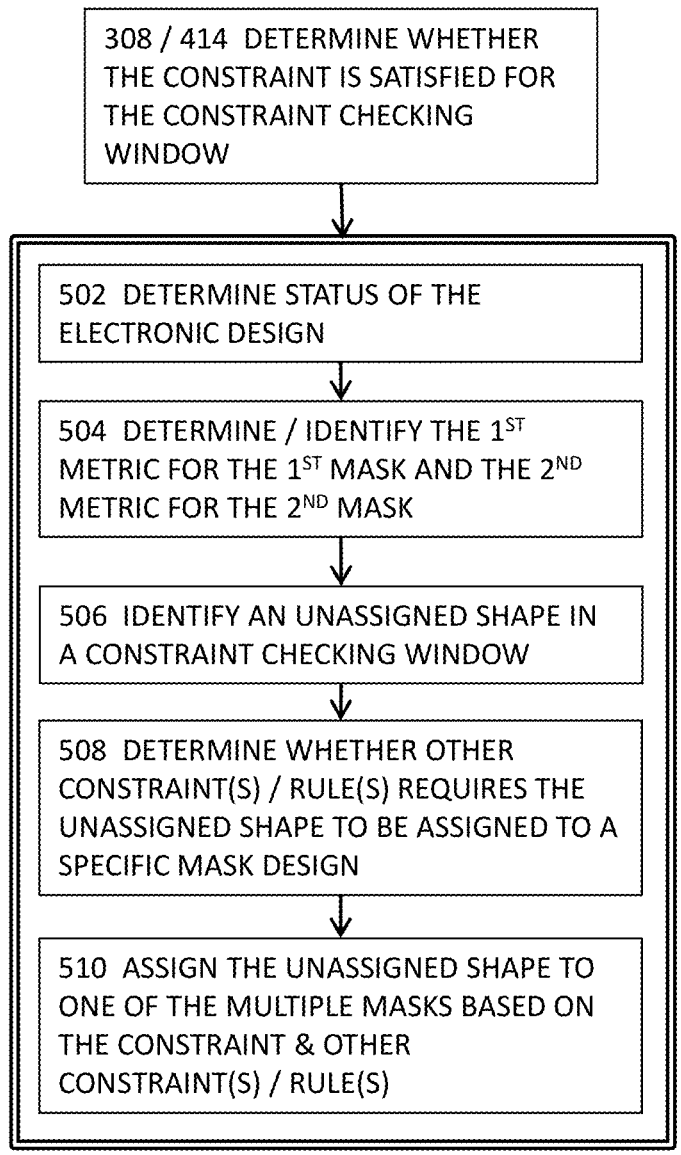
FIG. 5 illustrates more details of a sub-process or a sub-module of the method or system for implementing a physical electronic design of an electronic circuit using one or more constraint checking windows as illustrated in FIG. 3 or FIG. 4 in some embodiments.

FIG. 5 illustrates more details of a sub-process or a sub-module of the method or system for using one or more constraint checking windows in implementing an electronic design for multiple-patterning lithography as illustrated in FIG. 3 or FIG. 4 in some embodiments. In some embodiments, the process or module 308 or 414 may further comprise the respective sub-process or sub-module 502 of determining the status of the electronic circuit design. The status may comprise whether the electronic circuit design is complete or whether the electronic circuit design is incomplete and still represents a work-in-progress in some embodiments. In some embodiments, the process or module 308 or 414 may further comprise the respective sub-process or sub-module 504 of determining or identifying a first metric for the first mask and a second metric for the second mask for a multiple-patterning lithography process involving two or more masks. In some embodiments where a constraint requires a maximal relative density or a density match or balance among the multiple masks, the first metric or the second metric may comprise a cumulative area of a certain material or cumulative density in a mask. In some embodiments, the process or module 308 or 414 may further comprise the respective sub-process or sub-module 506 of identifying an unassigned shape in the current constraint checking window. In some embodiments, the process or module 308 or 414 may further comprise the respective sub-process or sub-module 508 of determining whether one or more other constraints or rules require the unassigned shape to be assigned to a specific mask design. For example, a mask splitting constraint or a same mask rule may require a specific shape be assigned to a specific mask. In some embodiments, the process or module 308 or 414 may further comprise the respective sub-process or sub-module 510 of assigning the unassigned shape to one of the multiple masks based at least in part upon the one or more constraints identified at 302 or 414 or the one or more other constraints or rules identified or determined at 508. In these embodiments, the method or system assigns the unassigned shape to a particular mask based on the constraints, updates the metric of the respective mask to reflect the assignment, and further determines whether the constraints are satisfied. It shall be noted that although an assignment of a single shape to a single mask may not tip the balance or imbalance of, for example, shapes or densities much. Nonetheless, the method or system assigns the shapes while taking the constraints into account will ensure that the constraints be satisfied.

Figure 6:
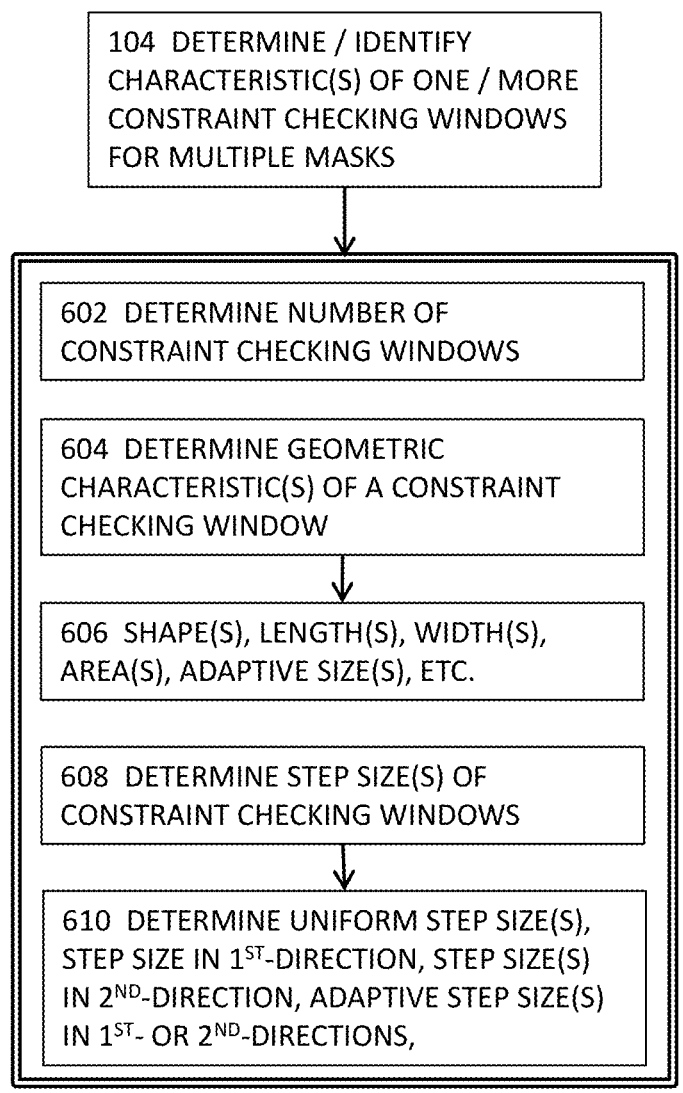
FIG. 6 illustrates more details of a sub-process or a sub-module of the method or system for implementing a physical electronic design of an electronic circuit using one or more constraint checking windows as illustrated in FIG. 1 in some embodiments.

FIG. 6 illustrates more details of a sub-process or a sub-module of the method or system for using one or more constraint checking windows in implementing an electronic design for multiple-patterning lithography as illustrated in FIG. 1 in some embodiments. In some embodiments, the process or module 104 may comprise the respective process or module 602 of determining a number of constraint checking windows for an electronic circuit design. In some embodiments, the process or module 104 may comprise the respective process or module 604 of determining one or more geometric characteristics of a constraint checking window. In some embodiments, the respective process or module 604 of determining one or more geometric characteristics may comprise the sub-process or sub-module 606 of determining one or more sizes, widths, lengths, shapes, areas, orientations, or adaptive sizes, etc. of one or more constraint checking windows. In some of these embodiments, an adaptive size may be determined based at least in part upon load balancing in processing resources or based at least in part upon the complexity or number of shapes that need to be processed in a particular region. For example, if the method or the system executes multiple threads of execution to process an electronic circuit or processes a plurality of constraint checking windows in parallel or in a distributed computing environment, the method or the system may dynamically adjust the size of the constraint checking windows to balance the loads of the threads, parallel processing nodes, or distributed computing nodes. In some of these embodiments, the method or the system may downsize the constraint checking windows for areas with higher shape densities (e.g., number of shapes per unit constraint checking window size) and upsize the constraint checking windows for areas with lower shape densities such that each thread of execution may process approximately similar number of shapes for the respective constraint checking window. In some embodiments, the method or the system may determine increase the size of the constraint checking windows for more powerful processing nodes in a distributed computing environment and decrease the size of the constraint checking windows for less powerful processing nodes such that these processing nodes with unequal processing resources may complete each task in approximately similar amount of time.

In some embodiments, the process or module 104 may comprise the respective process or module 608 of determining one or more step sizes of one or more constraint checking windows. In some embodiments the process or module 608 may comprise the respective sub-process or sub-module 610 of determining one or more uniform step sizes, one or more step sizes in a first direction, one or more step sizes in a second direction, or one or more adaptive step sizes or one or more adaptive constraint checking window sizes in the first or the second directions. In some of these latter embodiments, an adaptive step size may be determined based at least in part upon load balancing in processing resources or based at least in part upon the complexity or number of shapes that need to be processed in a particular region. For example, if the method or the system executes multiple threads of execution to process an electronic circuit or processes a plurality of constraint checking windows in parallel or in a distributed computing environment, the method or the system may dynamically adjust the step size to balance the loads of the threads, parallel processing nodes, or distributed computing nodes. In some of these embodiments, the method or the system may decrease the step size the constraint checking windows for areas with higher shape densities (e.g., number of shapes per unit constraint checking window size) and increase the step size of the constraint checking windows for areas with lower shape densities such that each thread of execution may process approximately similar number of shapes for the respective constraint checking window.

Figure 7A:
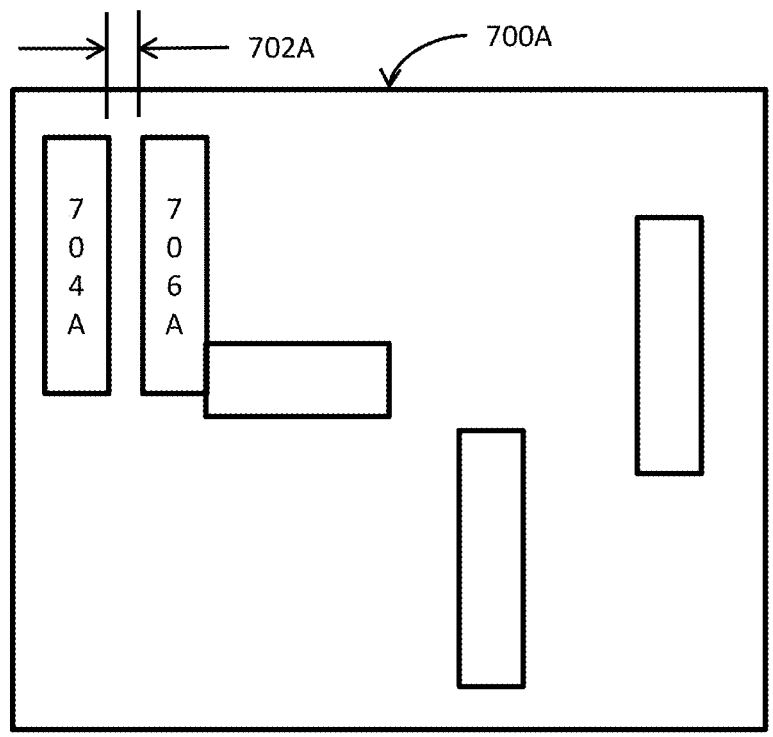
FIGS. 7A-H illustrate an example of a part of a method or a system for implementing a physical electronic design of an electronic circuit using one or more constraint checking windows in some embodiments.
Figure 7B:
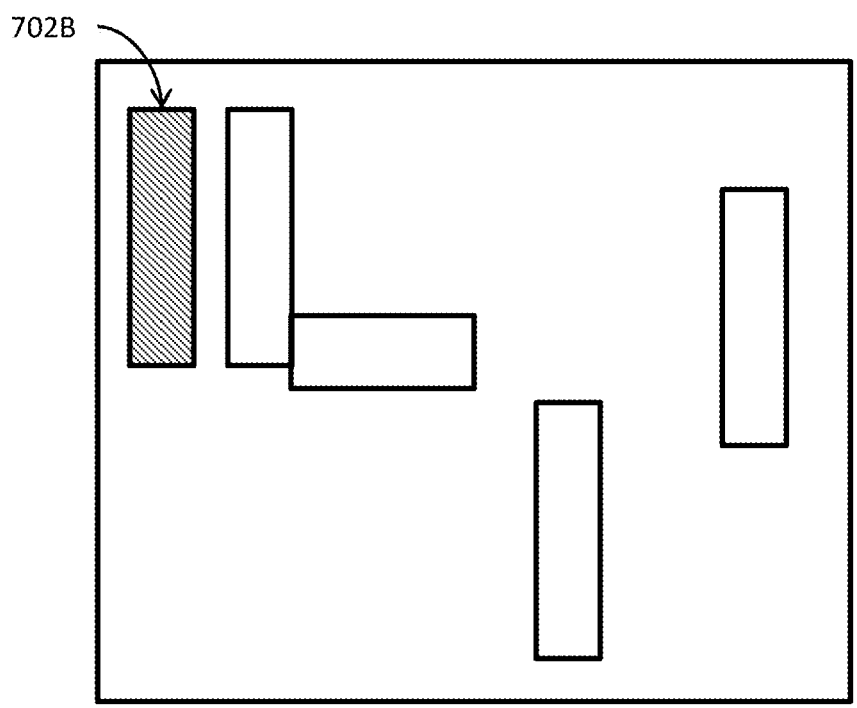
Figure 7C:
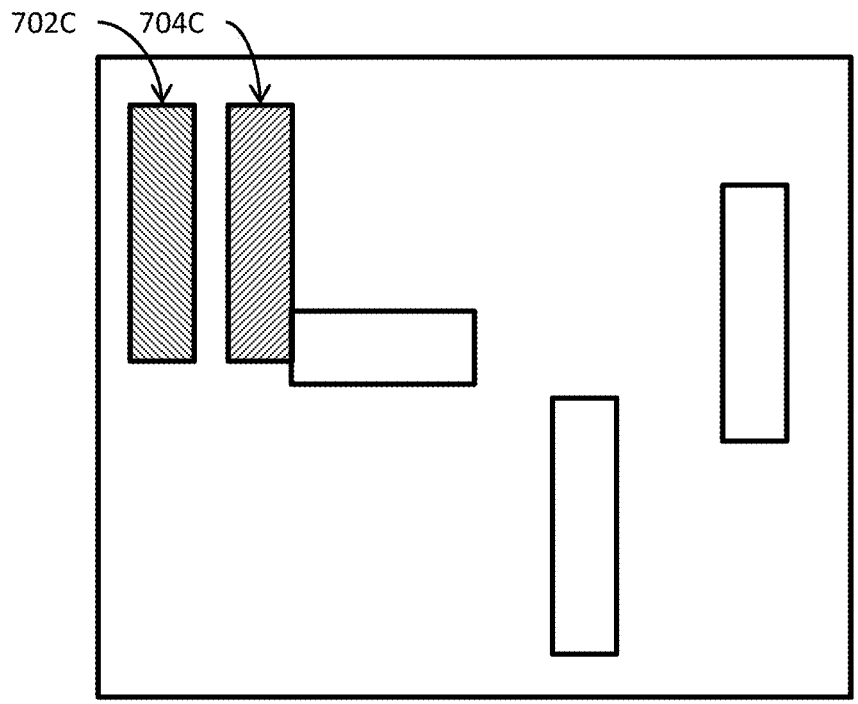
Figure 7D:
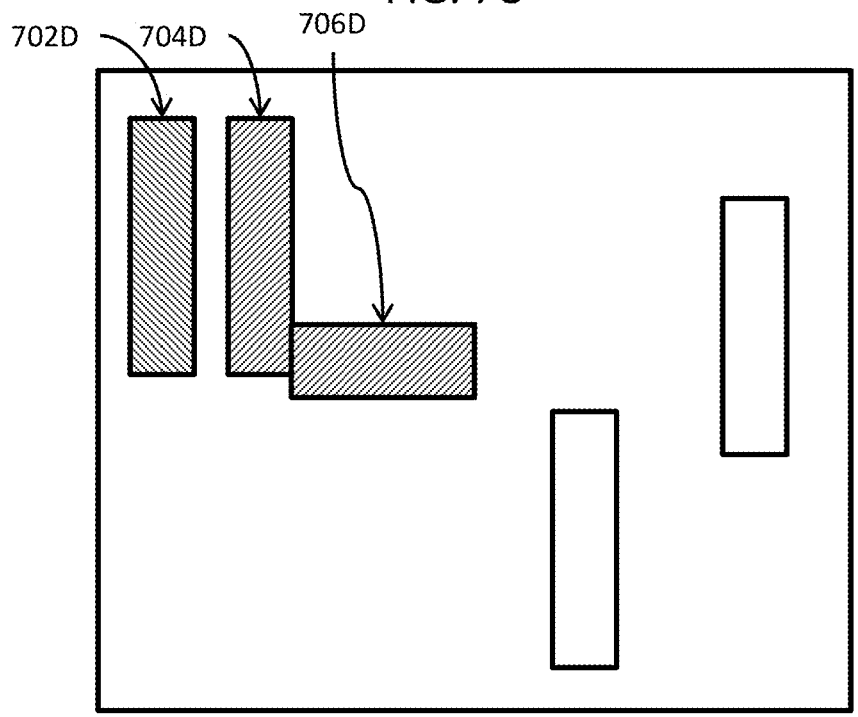
Figure 7E:
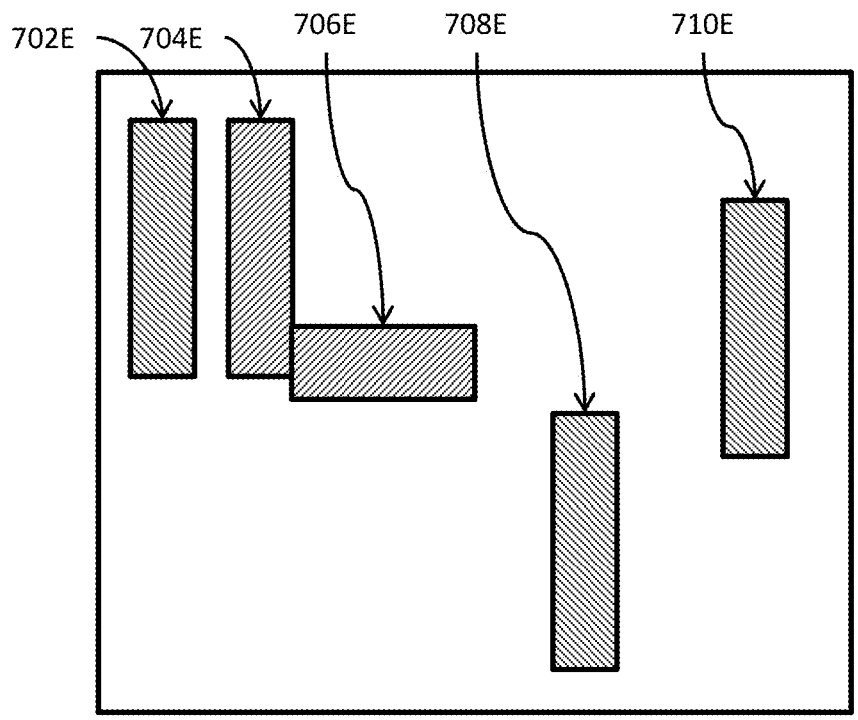
Figure 7F:
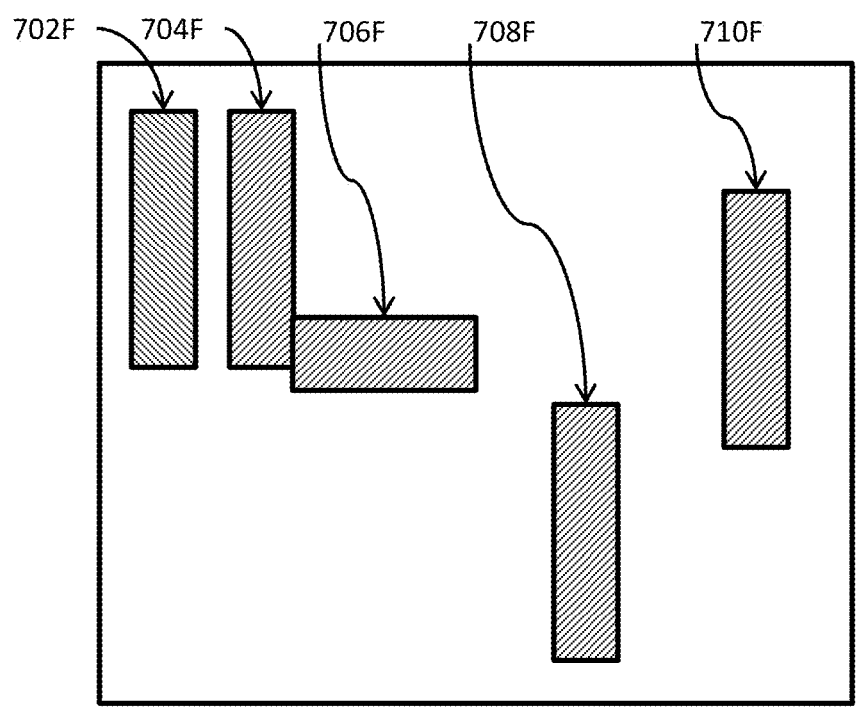

FIGS. 7A-H illustrate an example of a part of a method or a system for using one or more constraint checking windows in implementing an electronic design for multiple-patterning lithography in some embodiments. More specifically, FIG. 7A illustrates an exemplary rectangular constraint checking window 700A including five metal shapes that have not been assigned to any masks for multiple-patterning lithography processes. For the ease of illustration and explanation, it is first assumed that the electronic circuit design is subject to a double-patterning lithography process with two masks. It shall be understood that the method as illustrated by FIGS. 7A-H shall not be limited to a double-patterning process. It is also assumed that the electronic circuit design is subject to a foundry-imposed maximal relative metal density constraint or a metal density balance or metal density match constraint that requires FIG. 7A also shows that the spacing 702A between the shape 704A and 706A is less than the minimal printable size of the lithography process that is used to print the electronic circuit. FIG. 7B illustrates the same constraint checking window with the same five shapes. The method or the system begins processing the first metal shape 702B and assigns this particular metal shape to a first mask as indicated by the hatch pattern. It shall be noted that the hatch pattern for the metal shape 702B is for illustration and explanation purposes, and that other means of correlating a shape with a mask may also be used as described in some of the preceding paragraphs. The method or the system may then update the cumulative area or density of the first mask to reflect the assignment of metal shape 702B to the first mask. FIG. 7C illustrates that the method or the system identifies the next metal shape 704C for processing. Because the method maintains the cumulative metal area or metal density for each of the two masks, and further because the first metal density of the first mask is higher than the second metal density of the second mask, which is zero after the assignment of the metal shape 702B to the first mask, the method or the system assigns the metal shape 704C to the second mask. The method or the system then updates the cumulative metal area or the cumulative metal density for the second mask after the assignment of the metal shape 704C. After the assignment of the metal shape 704C, the first metal density of the first mask is equal to the second metal density of the second mask, assuming that metal shape 702C is of the same size as metal shape 704C. FIG. 7D illustrates that the method or the system identifies the next metal shape, 706D. Assuming that the electronic circuit design is also subject to a constraint that requires two connected shapes be assigned to the same mask, and that this constraint is not to be relaxed or superseded by the maximal relative density constraint, the method or the system may then assigns the metal shape 706D to the second mask as indicated by the same hatch pattern as that of the metal shape 704D. At this point, the second metal density of the second mask is higher than the first metal density of the first mask due to the assignment of the metal shape 706D to the second mask. FIG. 7E illustrates the same constraint checking window in which the two remaining metal shapes, 708E and 710E, are both assigned to the first mask as the metal shape 702E. This assignment may occur if the method or the system determines that the second metal density of the second mask is higher than the first metal density of the first mask prior to the assignment of the metal shapes 708E and the assignment of the metal shape 710E to any particular masks. It shall be noted that metal shapes 708E and 710E are not placed in the electronic circuit design in the proximity of other shapes with a spacing value less than a printable limit in a single mask. It is further assumed that 708E and 710E are not predetermined to belong to any specific mask. Therefore, the metal shapes 708E and 710E may be assigned to either the first mask or the second mask. In this example as illustrated in FIG. 7E, both shapes are assigned to the first mask due to the maximal relative density constraint or a density match or balance constraint. FIG. 7F illustrates the same constraint checking window in which the two remaining metal shapes, 708F and 710F, are both assigned to the second mask as the metal shape 702F. This assignment may occur if the method or the system determines that the first metal density of the first mask is higher than the second metal density of the second mask prior to the assignment of the metal shapes 708F and the assignment of the metal shape 710F to any particular masks. It shall be noted that metal shapes 708F and 710F are not placed in the electronic circuit design in the proximity of other shapes with a spacing value less than a printable limit in a single mask. It is further assumed that 708F and 710F are not predetermined to belong to any specific mask. Therefore, the metal shapes 708F and 710F may be assigned to either the first mask or the second mask. In this example as illustrated in FIG. 7F, both shapes are assigned to the second mask due to the maximal relative density constraint or a density match or balance constraint.

Figure 7G:
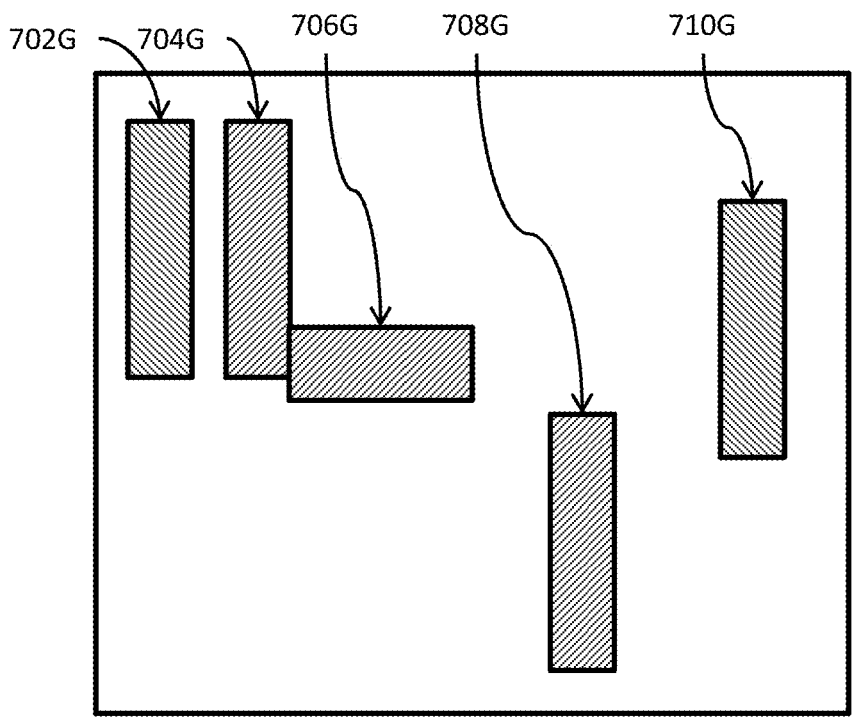

FIG. 7G illustrates the same constraint checking window in which the first remaining metal shape, 708G, is assigned to the second mask as the metal shape 704G or 706G. This assignment may occur if the method or the system determines that the first metal density of the first mask is higher than the second metal density of the second mask prior to the assignment of the metal shapes 708G to any particular masks. The other remaining metal shape, 710G, is assigned to the first mask as the metal shape 702G. This may be done if the first metal density of the first mask is determined to be lower than the second metal density of the second mask after the assignment of metal shape 708G to the second mask. It shall be noted that metal shapes 708G and 710G are not placed in the electronic circuit design in the proximity of other shapes with a spacing value less than a printable limit in a single mask. It is further assumed that 708G and 710G are not predetermined to belong to any specific mask. Therefore, the metal shapes 708G and 710G may be assigned to either the first mask or the second mask. In this example as illustrated in FIG. 7G, metal shape 708G is assigned to the second mask, and metal shape 710G is assigned to the first mask due to the maximal relative density constraint or a density match or balance constraint.

Figure 7H:
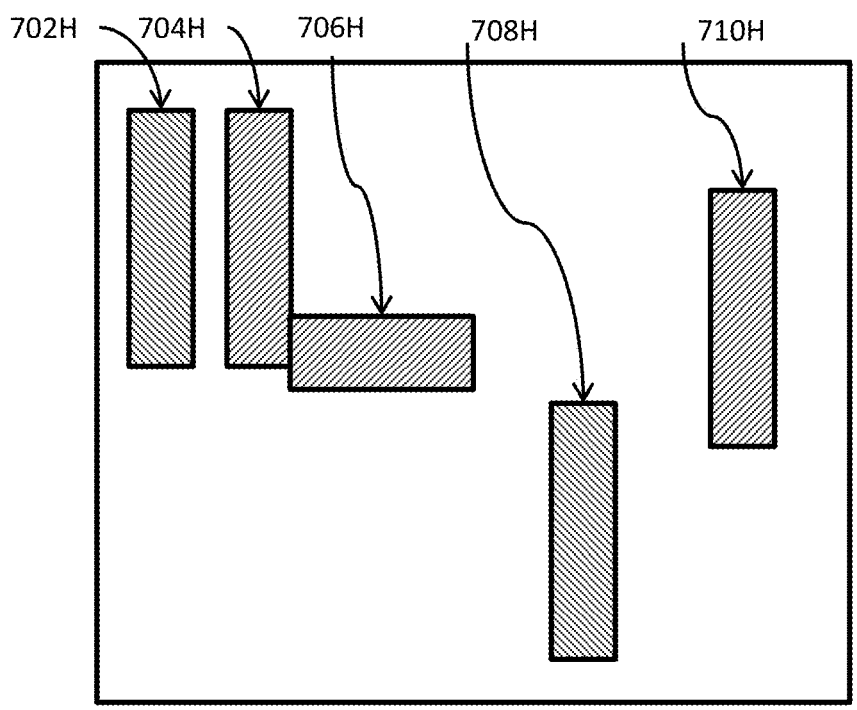

FIG. 7H illustrates the same constraint checking window in which the first remaining metal shape, 708H, is assigned to the first mask as the metal shape 702H. This assignment may occur if the method or the system determines that the first metal density of the first mask is lower than the second metal density of the second mask prior to the assignment of the metal shapes 708H to any particular masks. The other remaining metal shape, 710H, is assigned to the second mask as the metal shapes 704H and 706H. This may be done if the first metal density of the first mask is determined to be higher than the second metal density of the second mask after the assignment of metal shape 708H to the second mask. It shall be noted that metal shapes 708H and 710H are not placed in the electronic circuit design in the proximity of other shapes with a spacing value less than a printable limit in a single mask. It is further assumed that 708H and 710H are not predetermined to belong to any specific mask. Therefore, the metal shapes 708H and 710H may be assigned to either the first mask or the second mask. In this example as illustrated in FIG. 7H, metal shape 708H is assigned to the first mask, and metal shape 710H is assigned to the second mask due to the maximal relative density constraint or a density match or balance constraint. In this example, the method or the system assigns the shapes to multiple masks while taking into account the density constraint and thus reduces the probability of re-performing the mask splitting processes with conventional mask splitting algorithms for one or even more times in order to cope with the density constraint(s).

System Architecture Overview

Figure 8:
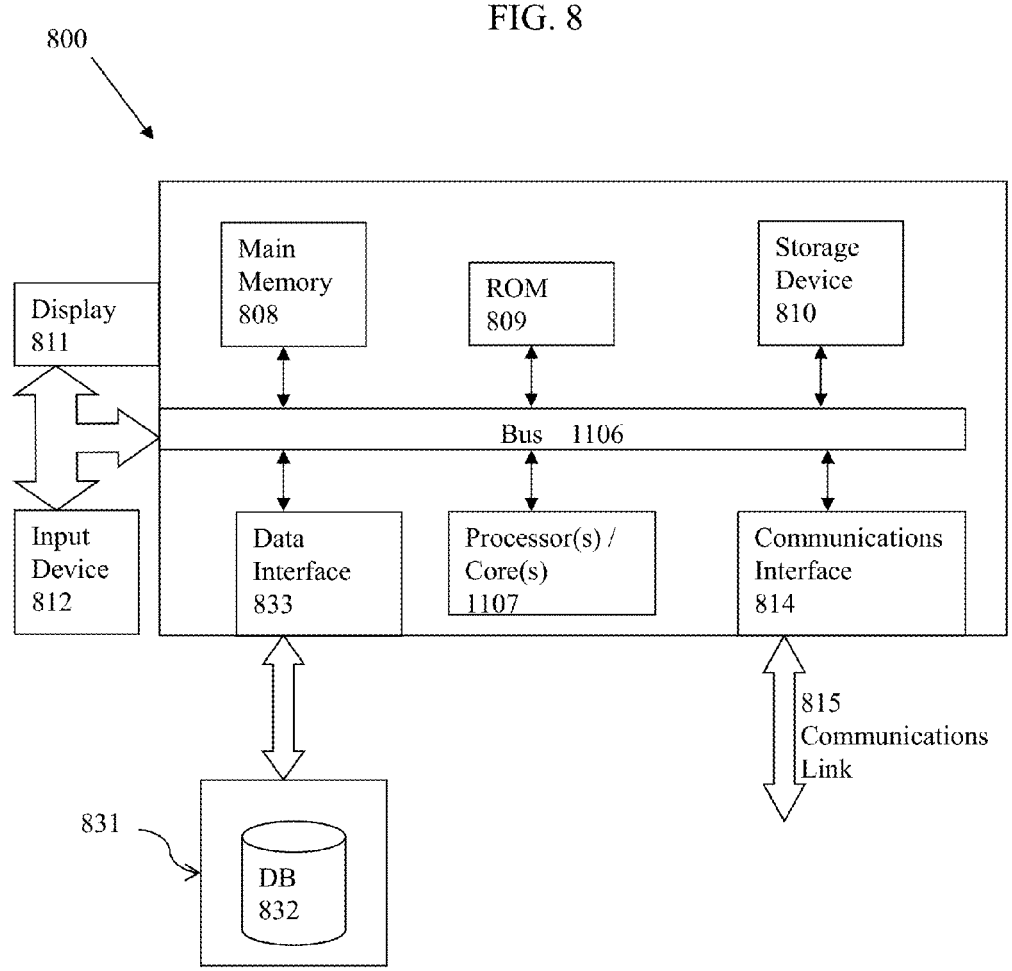
FIG. 8 illustrates a high level flow diagram for implementing a physical electronic design of an electronic circuit using one or more constraint checking windows in some embodiments.

FIG. 8 illustrates a block diagram of an illustrative computing system 800 suitable for implementing some embodiments of the method or system for implementing electronic circuit designs with electro-migration awareness as described in the preceding paragraphs with reference to various figures. Computer system 800 includes a bus 806 or other communication mechanism for communicating information, which interconnects subsystems and devices, such as processor 807, system memory 808 (e.g., RAM), static storage device 809 (e.g., ROM), disk drive 810 (e.g., magnetic or optical), communication interface 814 (e.g., modem or Ethernet card), display 811 (e.g., CRT or LCD), input device 812 (e.g., keyboard), and cursor control (not shown).

According to one embodiment, computer system 800 performs specific operations by one or more processor or processor cores 807 executing one or more sequences of one or more instructions contained in system memory 808. Such instructions may be read into system memory 808 from another computer readable/usable storage medium, such as static storage device 809 or disk drive 810. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 807, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout shapes or nets are created or modified.

The term "computer readable storage medium" or "computer usable storage medium" as used herein refers to any medium that participates in providing instructions to processor 807 for execution. Such a medium may take many forms, including but not limited to, non-volatile media and volatile media. Non-volatile media includes, for example, optical or magnetic disks, such as disk drive 810. Volatile media includes dynamic memory, such as system memory 808.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 800. According to other embodiments of the invention, two or more computer systems 800 coupled by communication link 815 (e.g., LAN, PTSN, or wireless network) may perform the sequence of instructions required to practice the invention in coordination with one another.

Computer system 800 may transmit and receive messages, data, and instructions, including program, i.e., application code, through communication link 815 and communication interface 814. Received program code may be executed by processor 807 as it is received, and/or stored in disk drive 810, or other non-volatile storage for later execution. In an embodiment, the computer system 800 operates in conjunction with a data storage system 831, e.g., a data storage system 831 that contains a database 832 that is readily accessible by the computer system 800. The computer system 800 communicates with the data storage system 831 through a data interface 833. A data interface 833, which is coupled to the bus 806, transmits and receives electrical, electromagnetic or optical signals that include data streams representing various types of signal information, e.g., instructions, messages and data. In embodiments of the invention, the functions of the data interface 833 may be performed by the communication interface 814.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing a physical electronic design of an electronic circuit using one or more constraint checking windows, comprising:
    using at least one processor or at least one processor core to perform a process the process comprising:
    identifying a constraint for multiple mask designs of a multiple-patterning lithography process for manufacturing the electronic circuit;
    identifying or determining a first characteristic of a first constraint checking window; and
    determining whether the constraint is satisfied for the first constraint checking window, or is satisfied for a physical design for an assignment of a first shape in the physical electronic design to a first mask design of the multiple mask designs.

2. The computer implemented method of claim 1, the action of determining whether the constraint is satisfied comprising:
    assigning the first shape in the physical electronic design to the first mask design of the multiple mask designs.

3. The computer implemented method of claim 1, the process further comprising:
    determining a first metric for the first mask design in the first constraint checking window or in the physical electronic design; and
    performing one or more corrective actions on the physical electronic design.

4. The computer implemented method of claim 3, the process further comprising:
    determining a second metric for a second mask design in the first constraint checking window or in the physical electronic design.

5. The computer implemented method of claim 4, the process further comprising:
    identifying a second shape in the first constraint checking window for the physical electronic design; and
    assigning the second shape to the first mask design or the second mask design of the multiple mask designs based at least in part upon a first criterion that is derived from the constraint.

6. The computer implemented method of claim 5, wherein the first criterion is derived from the constraint by performing at least:
    comparing the first metric with the second metric; and
    determining whether a result of the action of comparing the first metric with the second metric complies with the constraint.

7. The computer implemented method of claim 4, wherein the first metric or the second metric comprises a first cumulative area of shapes of a first material or a first relative density of the first material in the first constraint checking window or in a respective mask design of the multiple mask designs.

8. The computer implemented method of claim 7, the process further comprising:
    determining a first metric for the second constraint checking window or for the first mask design of the physical electronic design;
    determining a second metric for a second constraint checking window or for the second mask design of the physical electronic design; and
    assigning one or more shapes in the second constraint checking window based at least in part on a second criterion that is derived from the constraint.

9. The computer implemented method of claim 8, wherein the first characteristic of the first constraint checking window comprises one or more of a geometric characteristic of the first constraint checking window in a first direction, an adaptive size of the first constraint checking window in the first direction, a step size for the first constraint checking window in the first direction, an adaptive step size for the first constraint checking window in the first direction, a gap between the first constraint checking window and an adjacent constraint checking window in the first direction, and an overlap between the first constraint checking window and the adjacent constraint checking window in the first direction.

10. The computer implemented method of claim 8, wherein the second criterion is derived from the constraint by performing at least:
    comparing the first metric with the second metric; and
    determining whether a result of the action of comparing the first metric with the second metric complies with the constraint.

11. The computer implemented method of claim 8, wherein the first metric or the second metric comprises a second cumulative area of shapes of a first material or a second relative density of the first material in the second constraint checking window or in a respective mask design of the multiple mask designs.

12. The computer implemented method of claim 4, the process further comprising:
    identifying or determining a range of influence in the physical electronic design for the first constraint checking window or for the first shape;
    determining one or more changes within the range of influence based at least in part upon an assignment of the first shape to the first mask design of the multiple mask designs; and
    updating the first metric or the second metric based at least in part upon the one or more changes.

13. The computer implemented method of claim 12, the process further comprising:
    identifying a distribution of shapes in the physical electronic design;
    identifying a first distribution of shapes for the first mask design;
    identifying a second distribution of shapes for the second mask design; and
    identifying an order of processing for a plurality of constraint checking windows based at least in part on the distribution of shapes in the physical electronic design.

14. The computer implemented method of claim 13, the action of identifying the distribution of shapes in the physical electronic design comprising:
    identifying a first distribution of shapes for the first mask design; and
    identifying a second distribution of shapes for the second mask design.

15. The computer implemented method of claim 13, the process further comprising:
    processing the plurality of constraint checking windows in the order of processing to assign one or more shapes in the plurality of constraint checking windows to the multiple mask designs.

16. The computer implemented method of claim 1, wherein the first characteristic of the first constraint checking window comprises one or more of a geometric characteristic of the first constraint checking window in a first direction, an adaptive size of the first constraint checking window in the first direction, a step size for the first constraint checking window in the first direction, an adaptive step size for the first constraint checking window in the first direction, a gap between the first constraint checking window and an adjacent constraint checking window in the first direction, and an overlap between the first constraint checking window and the adjacent constraint checking window in the first direction.

17. The computer implemented method of claim 1, the process further comprising:
    identifying a second constraint checking window for the physical electronic design;
    identifying a second characteristic of the second constraint checking window; and
    identifying one or more shapes in the second constraint checking window.

18. The computer implemented method of claim 17, wherein the second characteristic of the second constraint checking window is different from the first characteristic of the first constraint checking window.

19. An article of manufacture comprising a non-transitory computer readable storage medium having a sequence of instructions stored thereupon which, when executed by at least one processor or at least one processor core, causes the at least one processor or the at least one processor core to perform a method for implementing a physical electronic design of an electronic circuit using one or more constraint checking windows, the method comprising:
    using at least one processor or at least one processor core to perform a process, the process comprising:
    identifying a constraint for multiple mask designs of a multiple-patterning lithography process for manufacturing the electronic circuit;
    identifying or determining a first characteristic of a first constraint checking window; and
    determining whether the constraint is satisfied for the first constraint checking window, or is satisfied for a physical design for an assignment of a first shape in the physical electronic design to a first mask design of the multiple mask designs.

20. The article of manufacture of claim 19, the process further comprising:
    determining a first metric for the first mask design in the first constraint checking window or in the physical electronic design;
    performing one or more corrective actions on the physical electronic design; and
    determining a second metric for a second mask design in the first constraint checking window or in the physical electronic design.

21. The article of manufacture of claim 20, the process further comprising:
    identifying a second shape in the first constraint checking window for the physical electronic design; and
    assigning the second shape to the first mask design or a second mask design of the multiple mask designs based at least in part upon a first criterion that is derived from the constraint, wherein the first criterion is derived from the constraint by performing at least:
comparing the first metric with the second metric; and
determining whether a result of the action of comparing the first metric with the second metric complies with the constraint.

22. The article of manufacture of claim 20, the process further comprising:
identifying or determining a range of influence in the physical electronic design for the first constraint checking window or for the first shape;
determining one or more changes within the range of influence based at least in part upon an assignment of the first shape to the first mask design of the multiple mask designs;
updating the first metric or the second metric based at least in part upon the one or more changes;
identifying a distribution of shapes in the physical electronic design;
identifying a first distribution of shapes for the first mask design;
identifying a second distribution of shapes for the second mask design; and
identifying an order of processing for a plurality of constraint checking windows based at least in part on the distribution of shapes in the physical electronic design.

23. The article of manufacture of claim 19, wherein the first characteristic of the first constraint checking window comprises one or more of a geometric characteristic of the first constraint checking window in a first direction, an adaptive size of the first constraint checking window in the first direction, a step size for the first constraint checking window in the first direction, an adaptive step size for the first constraint checking window in the first direction, a gap between the first constraint checking window and an adjacent constraint checking window in the first direction, and an overlap between the first constraint checking window and the adjacent constraint checking window in the first direction.

24. The article of manufacture of claim 19, the process further comprising:
identifying the second constraint checking window for the physical electronic design;
identifying a second characteristic of the second constraint checking window; and
identifying one or more shapes in the second constraint checking window, wherein the second characteristic of the second constraint checking window is different from the first characteristic of the first constraint checking window.

25. A system for implementing a physical electronic design of an electronic circuit using one or more constraint checking windows, comprising:
at least one processor or at least one processor core that is to:
identify a constraint for multiple mask designs of a multiple-patterning lithography process for manufacturing the electronic circuit;
identify or determine a first characteristic of a first constraint checking window; and
determine whether the constraint is satisfied for the first constraint checking window, or is satisfied for a physical design for an assignment of a first shape in the physical electronic design to a first mask design of the multiple mask designs.

26. The system of claim 25, the at least one processor or at least one processor core further to:
determine a first metric for the first mask design in the first constraint checking window or in the physical electronic design;
perform one or more corrective actions on the physical electronic design; and
determine a second metric for a second mask design in the first constraint checking window or in the physical electronic design.

27. The system of claim 26, the at least one processor or at least one processor core further to:
identify a second shape in the first constraint checking window for the physical electronic design; and
assign the second shape to the first mask design or a second mask design of the multiple mask designs based at least in part upon a first criterion that is derived from the constraint, wherein the first criterion is derived from the constraint by using the at least one processor or the at least one processor core at least to:
compare the first metric with the second metric; and
determine whether a result of the action of comparing the first metric with the second metric complies with the constraint.

28. The system of claim 26, the at least one processor or at least one processor core further to:
identify or determine a range of influence in the physical electronic design for the first constraint checking window or for the first shape;
determine one or more changes within the range of influence based at least in part upon an assignment of the first shape to the first mask design of the multiple mask designs;
update the first metric or the second metric based at least in part upon the one or more changes;
identify a distribution of shapes in the physical electronic design;
identify a first distribution of shapes for the first mask design;
identify a second distribution of shapes for the second mask design; and
identify an order of processing for a plurality of constraint checking windows based at least in part on the distribution of shapes in the physical electronic design.

29. The system of claim 25, wherein the first characteristic of the first constraint checking window comprises one or more of a geometric characteristic of the first constraint checking window in a first direction, an adaptive size of the first constraint checking window in the first direction, a step size for the first constraint checking window in the first direction, an adaptive step size for the first constraint checking window in the first direction, a gap between the first constraint checking window and an adjacent constraint checking window in the first direction, and an overlap between the first constraint checking window and the adjacent constraint checking window in the first direction.

30. The system of claim 25, the at least one processor or at least one processor core further to:
identify a second constraint checking window for the physical electronic design;
identify a second characteristic of the second constraint checking window; and
identify one or more shapes in the second constraint checking window, wherein the second characteristic of the second constraint checking window is different from the first characteristic of the first constraint checking window.

* * * * *